US006275061B1

(12) United States Patent
Tomita

(10) Patent No.: US 6,275,061 B1
(45) Date of Patent: Aug. 14, 2001

(54) TESTING METHOD FOR A SUBSTRATE OF ACTIVE MATRIX DISPLAY PANEL

(75) Inventor: Satoru Tomita, Kawagoe (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/404,539

(22) Filed: Sep. 24, 1999

(30) Foreign Application Priority Data

Sep. 25, 1998 (JP) ..... 10-271838

(51) Int. Cl.[7] ..... G01R 31/02
(52) U.S. Cl. ..... 324/770
(58) Field of Search ..... 324/770, 765, 324/158.1, 753; 349/192

(56) References Cited

U.S. PATENT DOCUMENTS 5,377,030 * 12/1994 Suzuki et al. ..... 324/770
5,506,516 * 4/1996 Yamashita et al. ..... 324/770
5,576,730 * 11/1996 Shimada et al. ..... 345/98
5,608,558 * 3/1997 Katsumi ..... 349/192

FOREIGN PATENT DOCUMENTS 3-80225 4/1991 (JP) .
5-127192 5/1993 (JP) .
5-313132 11/1993 (JP) .
9-159997 6/1997 (JP) .

* cited by examiner

*Primary Examiner*—Vinh P. Nguyen
(74) *Attorney, Agent, or Firm*—Pillsbury Winthrop LLP

(57) ABSTRACT

In the substrate test method of, a first test circuit is connected to an array substrate, and a signal for turning on all the thin film transistors arranged on the array substrate is supplied to a scanning line driving circuit. Also, a predetermined voltage is applied to a signal line driving circuit through signal lines so as to supply a predetermined voltage to a storage capacitor electrode. Under this condition, a high voltage sufficient for forming a potential difference higher than that in the stage of forming a storage capacitor is applied to the storage capacitor line.

16 Claims, 7 Drawing Sheets

TESTING METHOD FOR A SUBSTRATE OF ACTIVE MATRIX DISPLAY PANEL

BACKGROUND OF THE INVENTION

The present invention relates to a method of testing a substrate, i.e., an array substrate of an active matrix type liquid crystal display panel device including switching elements each of which is formed of a thin film transistor using a polycrystalline silicon (polysilicon) film or the like as a semiconductor layer and pixel electrodes arranged to form a matrix or a method of testing flat panel display including a substrate, i.e., a liquid crystal display panel device including such an array substrate.

The array substrate included in an active matrix type liquid crystal display panel device is equipped with a plurality of scanning lines formed on an insulating substrate and a plurality of signal lines crossing these scanning lines. The array substrate is also equipped with a plurality of thin film transistors (TFT's) each using a polysilicon film as a semiconductor layer, which are formed at the cross points between the scanning lines and the signal lines, and with a plurality of pixel electrodes arranged in a plurality of pixel regions defined by these scanning lines and signal lines to form a matrix.

In the active matrix type liquid crystal display panel device, the electrical charge written in the liquid crystal capacitance between the pixel electrode and the counter electrode during the selected period of the scanning line is changed during the non-selected period by the parasitic capacitances, the off-leak current of the TFT element and the potential fluctuation of the adjacent signal lines so as to bring about a crosstalk generation or reduction of the contrast ratio. To suppress occurrence of such a problem, the liquid crystal display panel device of this type is constructed in general such that a storage capacitor is formed in parallel electrically with the liquid crystal capacitance formed between the pixel electrode and the counter electrode.

In the active matrix type liquid crystal display panel device using a polysilicon film, the storage capacitor is provided by a MOS structure. Specifically, the storage capacitor consists of a storage capacitor electrode formed of a polysilicon film doped with an impurity and a storage capacitor line consisting of a metal film arranged to face the storage capacitor electrode with an insulating film interposed therebetween.

Each of the semiconductor layer of the TFT consisting of the polysilicon film and the storage capacitor electrode, which are used in the particular liquid crystal display panel device, is formed by irradiating an amorphous silicon film formed on a glass substrate with an energy beam such as an excimer laser for annealing the amorphous silicon film.

In the process of forming the polysilicon film, amorphous silicon that is temporarily melted is recrystallized and solidified to form polysilicon. In this case, projections are formed on the surface of the resultant polysilicon film by, for example, a difference in volume between the amorphous silicon layer and the polysilicon film.

The thickness of a gate insulating film formed on the polysilicon film is substantially decreased above these projections. Therefore, if a potential difference is generated between the polysilicon film and a metal film formed on the gate insulating film, the withstand voltage characteristics of the transistor are deteriorated. As a result, local defects such as short-circuit and current leakage tend to take place in future between the polysilicon film (semiconductor layer of TFT) and the gate electrode and between the polysilicon film (storage capacitor electrode) and the storage capacitor line.

If such a defect is generated, the potential of the pixel electrode is held stationary, with the result that the pixel is kept lit. Further, since a DC voltage is kept applied between the counter electrode and the pixel electrode, the liquid crystal composition contained in the liquid crystal layer corresponding to the defective pixel region is deteriorated, leading to a serious problem in reliability.

BRIEF SUMMARY OF THE INVENTION

The present invention, which has been achieved in view of the problems described above, is intended to provide a test method of a substrate, in which short-circuit is positively brought about between the electrodes in respect of a pixel which may possibly become defective in future so as to limit the defects to local defects and, thus, to prevent the apparatus from being rejected from the market.

Another object of the present invention is to provide a test method of a substrate, in which a defective short-circuit between the electrodes forming a storage capacitor is improved in respect of a substrate having local defects the number of which is smaller than a predetermined number so as to improve the product yield and a reliability.

According to an aspect of the present invention, there is provided a test method of a substrate comprising pixel electrodes arranged to form a matrix, a plurality of scanning lines arranged along the rows of the pixel electrodes, a plurality of storage capacitor lines arranged along the scanning lines and applied a first voltage thereto, a plurality of signal lines arranged along the columns of the pixel electrodes and applied a fourth voltage which is in the range from a second voltage to a third voltage higher than the second voltage, a plurality of switching elements arranged in the vicinity of crossing points between the scanning lines and the signal lines and selectively applying the fourth voltage from the signal lines to the pixel electrodes, the method comprising the steps of: setting the switching elements associated with plural of the scanning lines ON state; applying voltages to the signal lines and the storage capacitor lines so that each potential difference between the storage capacitor lines and storage capacitor electrodes is substantially equal to or higher than a maximum potential difference between the first voltage and the fourth voltage; and maintaining the each potential difference between the storage capacitor lines and storage capacitor electrodes for a predetermined period.

In the method of the present invention, voltage that makes a potential difference between the storage capacitor line and the storage capacitor electrode higher than that in the step of forming the storage capacitor is kept applied to the storage capacitor line and the storage capacitor electrode for a predetermined period of time to make the pixel, in which a short-circuit defect is expected to take place between the electrodes forming a storage capacitor in future, locally defective. Then, the number of defects is counted, followed by supplying only those substrates which have defects the number of which is smaller than a predetermined number to the succeeding step.

It should also be noted that the substrates having defects the number of which is smaller than the predetermined number are electrically detached from the pixel electrodes of the pixel regions corresponding to the storage capacitor electrodes so as to improve the pixel in which a short-circuit defect has taken place to a semi-lit state.

It follows that the present invention provides a test method of a substrate which permits improving the product yield and the reliability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A method for testing an array substrate used in an active matrix type liquid crystal display panel device according to one embodiment of the present invention will now be described with reference to the accompanying drawings.

Figure 4:
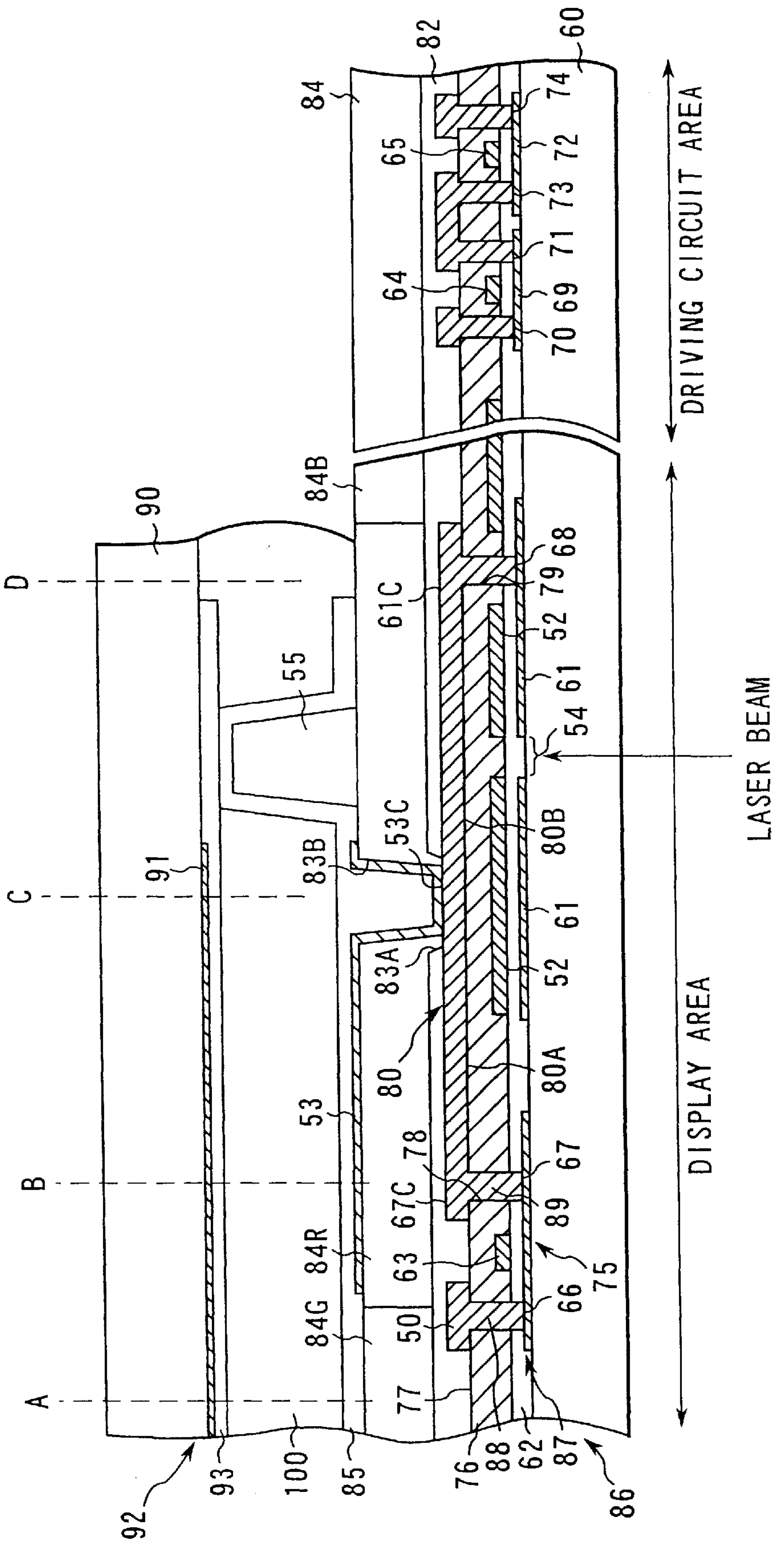
FIG. 4 is a cross sectional view along the line A-B-C-D shown in FIG. 3.

Specifically, a liquid crystal display panel device shown in FIG. 4 comprises an array substrate, a counter substrate arranged to face the array substrate, and a liquid crystal layer 100 held between the array substrate and the counter substrate.

The array substrate integrally comprises (m×n)-number of pixel electrodes 53 arranged to form a matrix, an m-number of scanning lines Y1 to Ym arranged along the rows of these pixel electrodes 53, an n-number of signal lines X1 to Xn arranged along the columns of the pixel electrodes 53, an (m×n)-number of thin film transistors 75 arranged as nonlinear switching elements in the vicinity of cross points between the scanning lines Y1 to Yn and the signal lines X1 to Xn in a manner to correspond to the (m×n)-number of the pixel electrodes 53, a scanning line driving circuit 18 for driving these scanning lines Y1 to Yn, and a signal line driving circuit 18 for driving the signal lines X1 to Xn.

A counter electrode 91 set at a reference potential and arranged to face a plurality of pixel electrodes is mounted to the counter substrate. A counter electrode driving circuit 20 for driving the counter electrode 91 is arranged as an external circuit electrically connected to the array substrate.

A liquid crystal capacitance CL is formed by the liquid crystal layer 100 interposed between the pixel electrode 53 and the counter electrode 91.

The array substrate comprises a plurality of storage capacitor elements, i.e., a pair of electrodes, for forming a storage capacitor CS electrically in parallel to the liquid crystal capacitance. To be more specific, the storage capacitor is formed a storage capacitor electrode 61 that is equal in potential to the pixel electrode 53 and a storage capacitor line 52 set at a predetermined potential. A storage capacitor driving circuit 21 for driving the storage capacitor line 52 is arranged as an external circuit electrically connected to the array substrate like the counter electrode driving circuit 20.

When the corresponding scanning line is driven by the scanning line driving circuit 18, the pixel electrode 53 of the corresponding column is selected to allow the signal lines X1 to Xn to be driven by the signal line driving circuit 19. In this step, each thin film transistor 75 is used as a switching element for applying a potential of these signal lines to the pixel electrodes 53 of these corresponding columns.

The scanning line driving circuit 18 successively supply a scanning voltage to the scanning lines Y1 to Ym with a horizontal scanning period. On the other hand, the signal line driving circuit 19 supplies a pixel signal voltage to the signal lines X1 to Xn in each horizontal scanning period.

Further, the signal line driving circuit 19, the scanning line driving circuit 18, the counter electrode driving circuit 20 and the storage capacitor driving circuit 21 are connected to a control circuit 22 forming a video signal, a control signal, etc.

Figure 1:
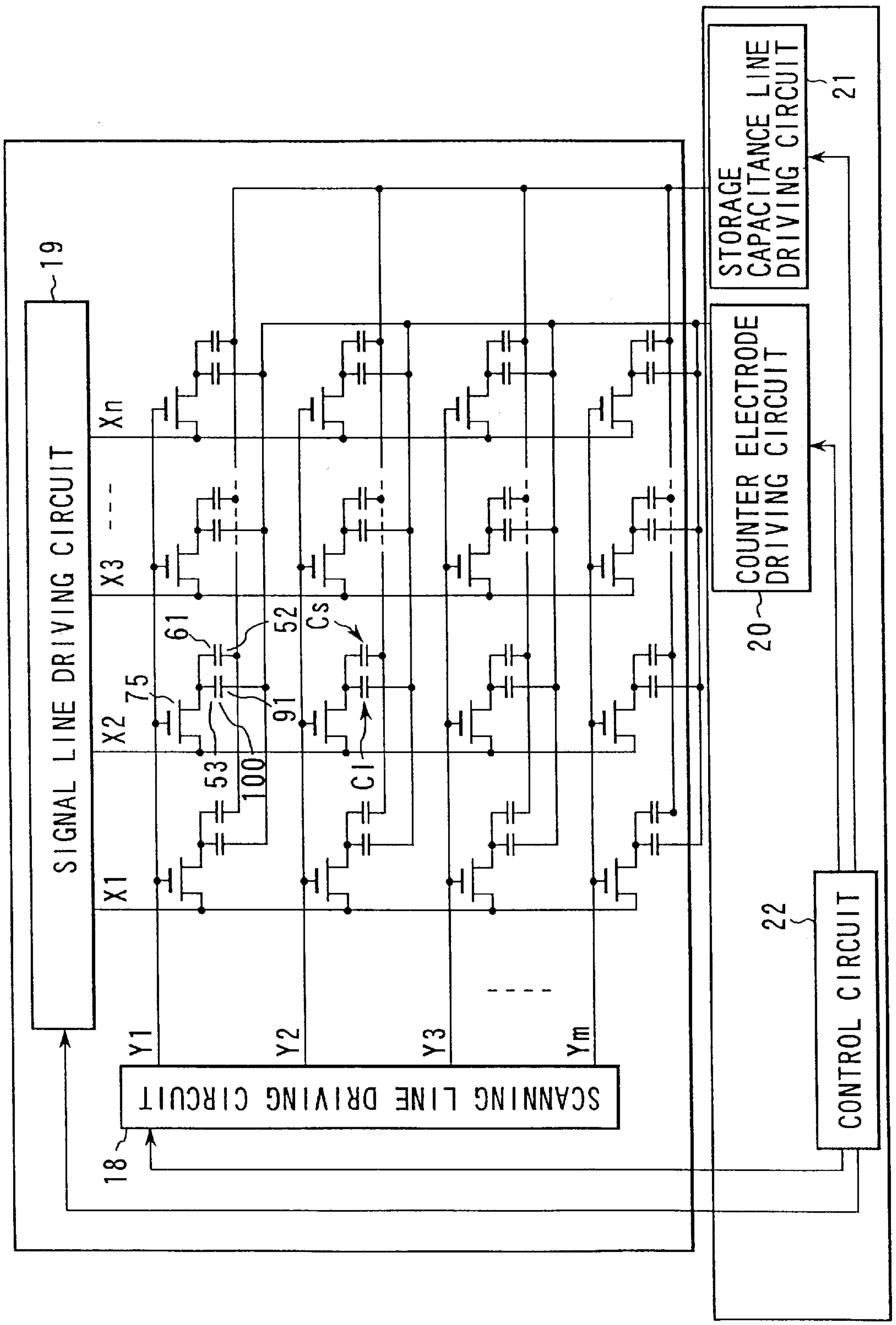
FIG. 1 schematically shows the construction of an active matrix type liquid crystal display panel device to which a substrate test method of the present invention is applied.
Figure 2:
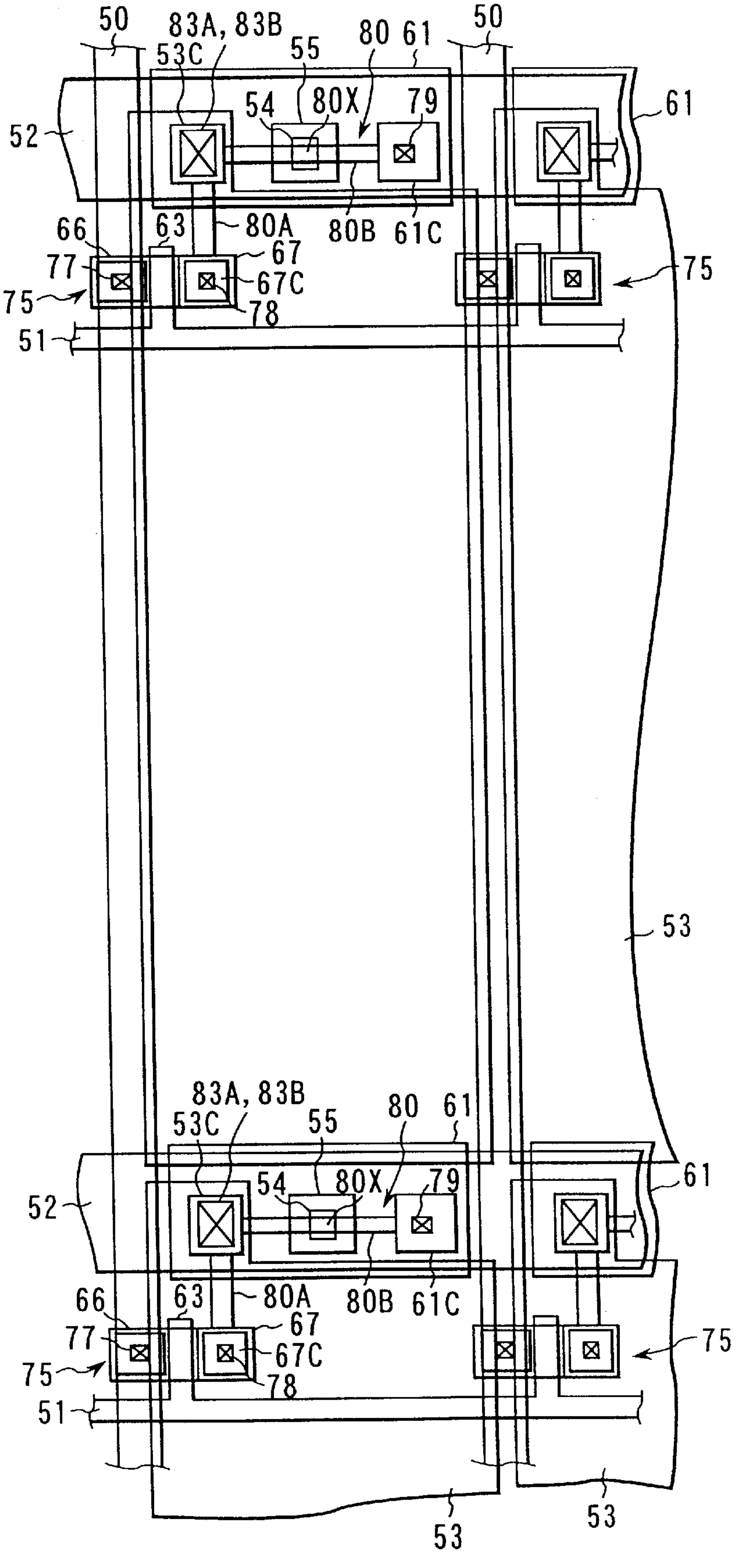
FIG. 2 is a plan view schematically showing a pixel region of the active matrix type liquid crystal display panel device shown in FIG. 1.
Figure 3:
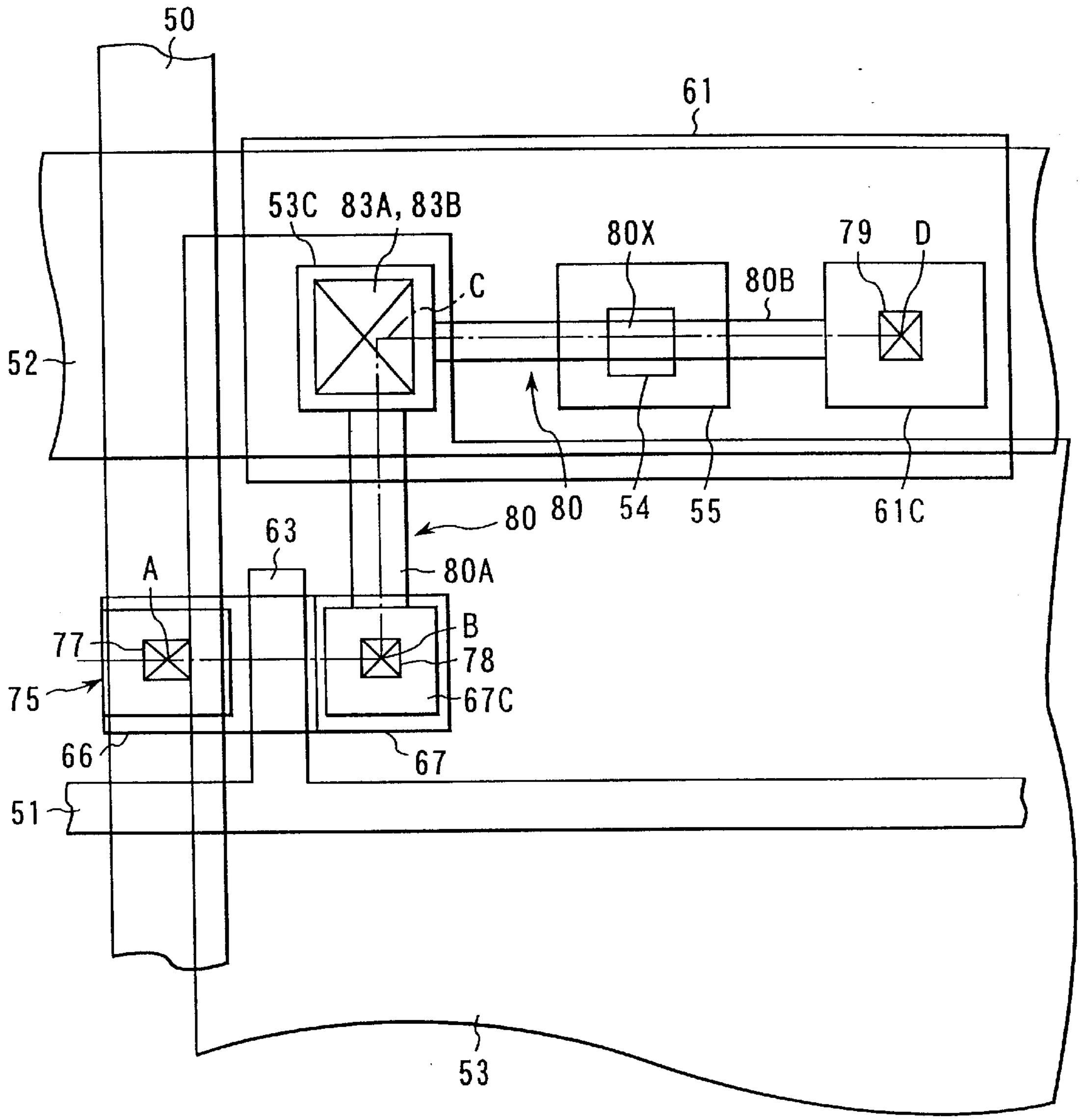
FIG. 3 is a plan view showing in a magnified fashion the region including a joining wiring of the active matrix type liquid crystal display panel device shown in FIG. 2.

As shown in FIGS. 2 to 4, a signal line 50 is arranged in a direction perpendicular to and apart from a scanning line 51 and a storage capacitor line 52 with an interlayer insulating film 76 interposed therebetween within a single pixel region of the array substrate 86. The storage capacitor line 52 and the scanning line 51, which extend in parallel, are formed within the same layer. A part of the storage capacitor line 52 is arranged to face a storage capacitor electrode 61 formed of a polysilicon film doped with an impurity, with a gate insulating film 62 interposed therebetween, to form the storage capacitor CS.

The pixel electrode 53 is arranged above the signal line 50 and the storage capacitor line 52 with the peripheral portion thereof overlapping thereon. The thin film transistor functioning as a switching element, i.e., the TFT 75, is arranged in the vicinity of the cross point between the signal line 50 and the scanning line 51. The TFT 75 consists of an N-channel type lightly doped drain type element, i.e., an element of an N-channel LDD structure.

The TFT 75 comprises a semiconductor layer 87 formed of the polysilicon film constituting the storage capacitor electrode 61 and a gate electrode 63. A drain region 66 and a source region 67 are formed in the semiconductor layer 87. Also, the gate electrode 63 consists of a part of the scanning line 51 arranged with a gate insulating film 62 interposed therebetween. The drain region 66 is electrically connected to the signal line 50 via a contact hole 77 so as to form a drain electrode 88. On the other hand, the joining wiring 80 serves to electrically connect the source region 67 to the pixel electrode 53 via a contact hole 78 so as to form a source electrode 89.

The joining wiring 80 electrically connects the source electrode 89 of the TFT 75, the pixel electrode 53 and the storage capacitor electrode 61 to each other.

To be more specific, the source region 67 is electrically connected to a first contact electrode 67C via the contact hole 78. The pixel electrode 53 is electrically connected to a second contact electrode 53C via contact holes 83A, 83B. Further, the storage capacitor electrode 61 is electrically connected to a third contact electrode 61C via a contact hole 79.

The first contact electrode 67C is electrically connected to the second contact electrode 53C by a first joining portion 80A of the joining wiring 80. As a result, the first joining portion 80A permits the source electrode 67 to be electrically connected to the pixel electrode 53.

The second contact electrode 53C is electrically connected to the third contact electrode 61C by a second joining portion 80B of the joining wiring 80. As a result, the second joining portion 80B permits the pixel electrode 53 to be electrically connected to the storage capacitor electrode 61. The second joining portion 80B is formed contiguous to the first joining portion 80A.

As a result, the source electrode 89 of the TFT 75, the pixel electrode 53 and the storage capacitor electrode 61 have the same potential.

At least a part of the second joining portion 80B includes a wiring portion 80X that does not overlap with the storage capacitor line 52 and the storage capacitor electrode 61. To be more specific, the storage capacitor line 52 and the storage capacitor electrode 61 have an aperture 54 in this embodiment at a predetermined region that overlap with the wiring portion 80X, as shown in FIGS. 2 to 4. As a result, the wiring portion 80X is exposed from the storage capacitor line 52 and the storage capacitor electrode 61 via the aperture 54, when viewed from the back side of the array substrate 86, as shown in FIG. 4. A columnar spacer 55 serving to keep the array substrate 86 and the counter substrate 92 a predetermined distance apart from each other is mounted to correspond to the aperture 54 of the storage capacitor line 52 and the storage capacitor electrode 61 to prevent a contrast ratio from being lowered by light leakage.

The particular construction described above is effective in that, where short-circuit has taken place between the second joining portion 80B close to the third contact electrode 61 and the storage capacitor line 52 or between the storage capacitor line 52 and the storage capacitor electrode 61, the wiring portion 80X exposed to the outside when viewed from the back side of the array substrate 86 is irradiated with a laser beam for cutting the wiring portion 80X. By cutting the wiring portion 80X of the joining wiring 80, it is possible to electrically isolating the short-circuit portion of the storage capacitor Cs from the TFT 75 so as to repair the short-circuit.

A method of manufacturing an active matrix type liquid crystal display panel device of the construction described above will now be described with reference to FIGS. 1 to 4.

In the first step, an amorphous silicon film, i.e., a-Si film, is deposited in a thickness of about 50 nm by, for example, a CVD method on a transparent insulating substrate 60 such as a glass substrate having a high melting point or a quartz substrate. In this step, an ion implantation is carried out for controlling the threshold value of the TFT 75. Then, an annealing is performed at 450° C. for one hour, followed by applying a dehydrogenation treatment and subsequently irradiating the deposited a-Si film with an excimer laser so as to convert the a-Si film into a polycrystalline film. Then, the silicon film that has been made polycrystalline, i.e., the polysilicon film, is patterned by a photo-etching method so as to form channel regions of TFT's formed in the pixel regions included in a display region, i.e., pixel TFT's 75, channel regions of TFT's formed in driving circuit region, i.e., circuit TFT's 69, 72, and the storage capacitor electrode 61 for forming a storage capacitor, together with the aperture 54.

In the next step, a silicon oxide ($SiO_x$) film is deposited on the entire surface of the substrate 60 in a thickness of about 100 nm by a CVD method, etc. to form a gate insulating film 62. Further, a metal film consisting of tantalum (Ta), chromium (Cr), aluminum (Al), molybdenum (Mo), tungsten (W), copper (Cu), a laminate film thereof, an alloy film thereof, e.g., Mo—W alloy film, is deposited on the entire surface of the gate insulating film 62 in a thickness of about 400 nm. Then, the resultant metal film is patterned in a desired pattern by a photo-etching method, etc. to form the scanning lines 51, the storage capacitor lines 52 positioned to face the storage capacitor electrode 61 with the gate insulating film 62 interposed therebetween, the gate electrode 63 of the pixel TFT 75 extending from the scanning line 51, the gate electrodes 64, 65 of the circuit TFT's 69, 72, and various wirings within the driving circuit region. In this step, the aperture 54 is also formed in the storage capacitor line 52 as in the storage capacitor electrode 61.

Then, impurities are implanted into the silicon film by means of an ion implantation method or an ion doping method using these gate electrodes 63, 64, 65 as a mask so as to form a drain region 66 and a source region 67 of the pixel TFT 75, a contact region 68 of the storage capacitor electrode 61, and a source region 70 and a drain region 71 of the N-channel type circuit TFT 69. In this embodiment, a high concentration of phosphorus ions were implanted at a dose of $5\times10^{15}$ atoms/cm$^2$ under an accelerating energy of 80 keV, using $PH_3/H_2$.

In the next step, the pixel TFT 75 and the N-channel type circuit TFT 69 within the driving circuit region were covered with a resist to prevent impurities from being implanted thereinto, followed by performing an impurity implantation using the gate electrode 64 of a P-channel type circuit TFT 72 as a mask so as to form a source region 73 and a drain region 74 of the P-channel type circuit TFT 72. In this embodiment, a high concentration of boron ions were at a dose of $5\times10^{15}$ atoms/cm$^2$ under an accelerating energy of 80 keV, using $B_2H_6/H_2$. After the ion implantation, impurities are injected to form an N-channel type LDD region in each of the pixel TFT 75 and the circuit TFT 69, followed by annealing the entire substrate so as to activate the impurities.

Then, a silicon dioxide ($SiO_2$) film is formed on the entire surface of the substrate 60 in a thickness of about 500 nm to form an interlayer insulating film 76. After formation of the interlayer insulating film, contact holes are formed through the gate insulating film 62 and the interlayer insulating film 76 by a photo-etching method, said contact holes including a contact hole 77 leading to the drain region 66 of the pixel TFT 75, a contact hole 78 leading to the source region 67, a contact hole 79 leading to a contact region 68 of the storage capacitor electrode 61, and contact holes leading to the source regions 70, 73 and the drain regions 71, 74 of the circuit TFT's 69 and 72, respectively.

Further, a metal film consisting of Ta, Cr, Al, Mo, W, Cu, a laminate thereof and an alloy thereof, e.g., Al-Nd alloy, is formed in a thickness of about 500 nm, followed by pattering the metal film in a predetermined shape by a photo-etching method. As a result, the signal line 50 is formed and, at the same time, the drain electrode 66 of the pixel TFT 75 is electrically connected to the signal line 50. Also formed simultaneously are a first contact electrode 67C electrically connected to the drain electrode 66 of the pixel TFT 75, a second contact electrode 53C electrically connected to a pixel electrode 53 that is to be formed later, and a third contact electrode 61C electrically connected to the storage capacitor electrode 61. Further, also formed simultaneously are the first joining portion 80A that permits the first contact electrode 67C and the second contact electrode 53C to be electrically connected to each other, and the second joining portion 80B that permits the second contact electrode 53C and the third contact electrode 61C to be electrically connected to each other. Still further, also formed are various wirings of the circuit TFT's 69 and 72 within the driving circuit region.

It should be noted that the first contact electrode 67C, the first joining portion 80A, the second contact electrode 53C, the second joining portion 80B and the second contact electrode 61C are all formed integral to constitute the joining wiring 80.

In the next step, a silicon nitride ($SiN_X$) film is deposited on the entire surface of the substrate 60 to form a protective insulating film 82, followed by forming a contact hole 83A leading to the second contact electrode 53C in the protective insulating film 82 by a photo-etching method. After formation of the contact hole 83A, colored layers 84R, 84G and 84B having, for example, pigments of red, green and blue dispersed therein, respectively, are formed in a thickness of about 2 $\mu$m in every pixel region. Then, formed is a contact hole 83B leading from a pixel electrode 53, which is to be described later, to the second contact electrode 53C.

Further, a transparent conductive film, e.g., an ITO (indium-tin oxide) film, is formed on the entire surface in a thickness of about 100 nm by a sputtering method, followed by pattering the transparent conductive film in a desired shape by a photo-etching method. As a result, the pixel electrode 53 is formed. At the same time, the pixel electrode 53 is electrically connected to the second contact electrode 53C, and the source electrode 67 of the pixel TFT 75 is electrically connected to the pixel electrode 53 via the first wiring portion 80A of the joining wiring 80.

Finally, the entire surface is coated with an organic insulating layer having, for example, a black pigment dispersed therein in a thickness of about 5 $\mu$m, followed by forming the columnar spacer 55 by a photo-etching method in a manner to close the aperture 54.

The array substrate 86 of the active matrix type liquid crystal display panel device thus manufactured is supplied to a test process.

Figure 5:
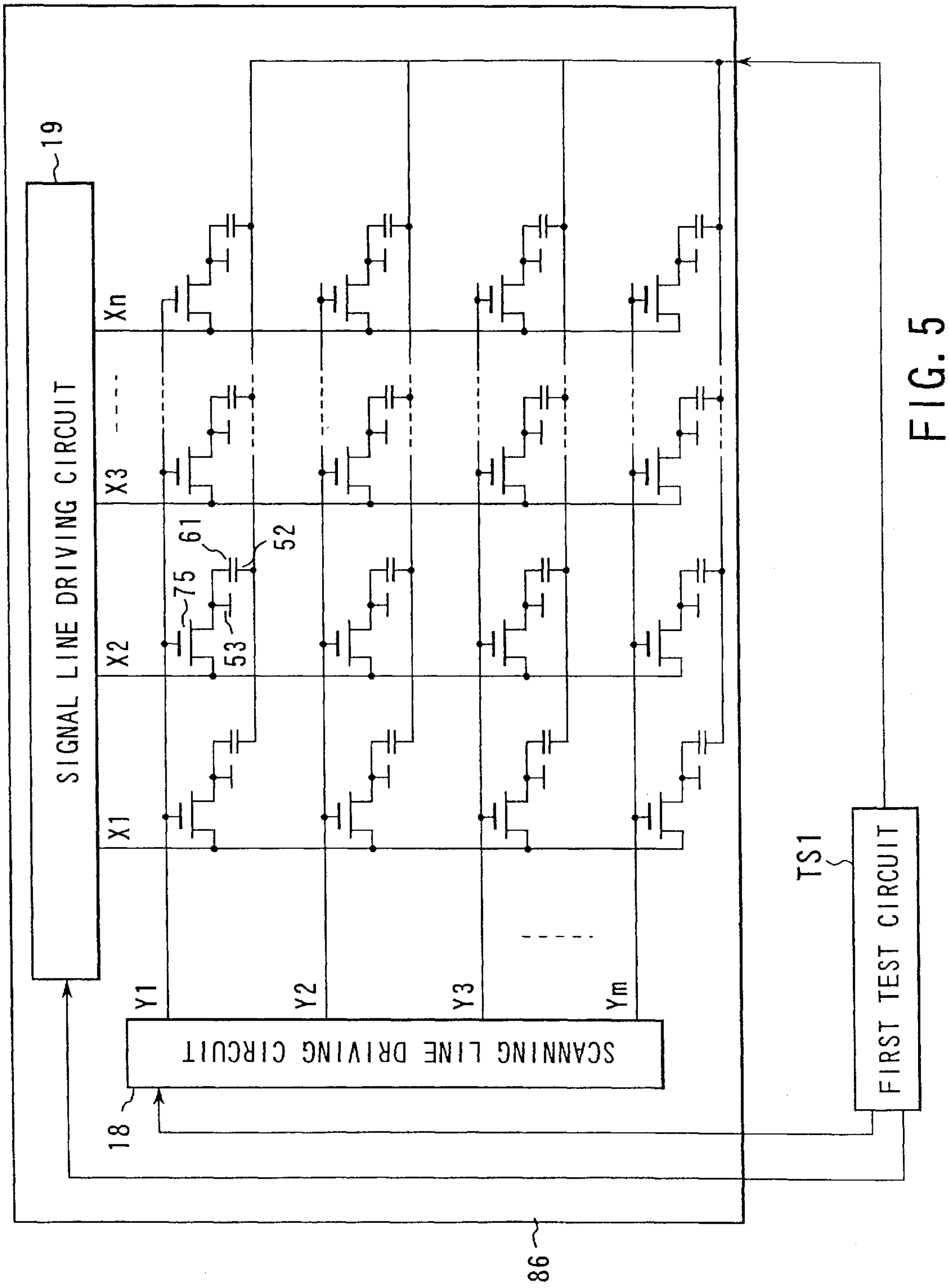
FIG. 5 is for explaining the step of applying a high voltage between a storage capacitor line and a storage capacitor electrode in the substrate test method of the present invention.
Figure 6:
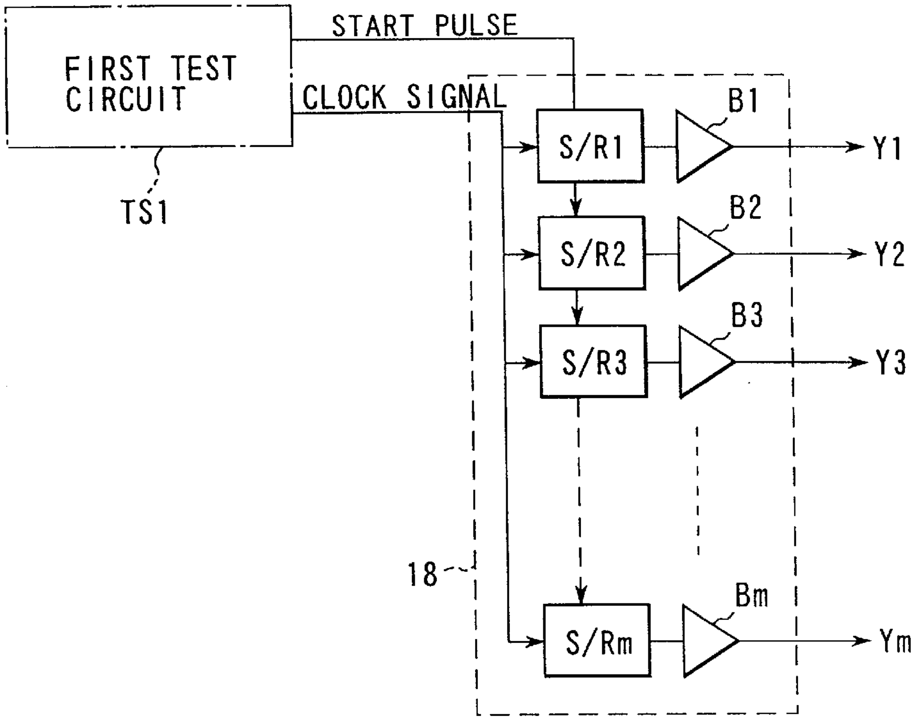
FIG. 6 schematically shows the construction of a scanning line driving circuit.

In the test process, a first test circuit TS1 is connected to the array substrate 86, as shown in FIG. 5. The first test circuit TS1 applies a high voltage between the storage capacitor electrodes and the storage capacitor lines, in respect of a pixel in which short-circuit may take place in future to bring about a pixel defect, to localize the defective pixel.

To be more specific, a liquid crystal display panel device using the TFT 75, in which a polysilicon film is used as a semiconductor layer, comprises a storage capacitor element for forming a storage capacitor. The storage capacitor element includes the storage capacitor electrode 61 consisting of a polysilicon film and the storage capacitor line 52 consisting of a metal film arranged to face the storage capacitor electrode 61 with the gate insulating film 62 interposed therebetween. The polysilicon film is formed by annealing an amorphous silicon film with an excimer laser, as described previously. In the annealing step, projections are likely to be formed on the surface of the polysilicon film. The projections thus formed cause the thickness of the gate insulating film formed on the polysilicon film to be substantially decreased, leading to deterioration of the withstand voltage characteristics.

Therefore, the first test circuit TS1 applies a high voltage higher than the voltage under the ordinary driving step between the storage capacitor elements, in which short-circuit and current leak may occur in future, i.e., between the storage capacitor electrode 61 consisting of a polysilicon film and the storage capacitor line 52 consisting of a metal film, so as to localized the defective pixel before forming a liquid crystal cell.

In the ordinary driving method, the TFT is kept turned off over substantially the entire driving time. Therefore, even if a high voltage is applied to the storage capacitor line 52, the storage capacitor electrode 61 is in a floating state, resulting in failure to generate a high potential difference to be storage capacitor element. In an array substrate having a display area of 8.4 inches, each of the storage capacitor elements is turned on for only a fraction of 1/27,000. In other words, it is necessary to operate the array substrate for 27,000 seconds, i.e., about 7.7 hours, in order to keep a high voltage applied for one second to each the storage capacitor elements of the pixels.

Therefore, the first test circuit TS1 supplies to the scanning line driving circuit 18 a signal that drives all the scanning lines Y1, Y2, . . . Ym to turn on all the TFT's 75 arranged in the direction of the column selected by these scanning lines, i.e., to render these TFT's 75 conductive. The first test circuit TS1 also supplies to the signal line driving circuit 19 a signal that drives all the signal lines X1, X2, . . . Xn to apply a predetermined potential through the signal lines to all the TFT's 75 that have been turned on.

To be more specific, the scanning line driving circuit 18 comprises an m-number of shift registers SR/R1 to S/Rm and an m-number of buffers B1 to Bm. These shift registers S/R1 to S/Rm are connected in series and serve to latch a start pulse supplied from the outside in response to a clock signal supplied from the outside so as to output in parallel shift pulses to the buffers B1 to Bm.

Figure 7:
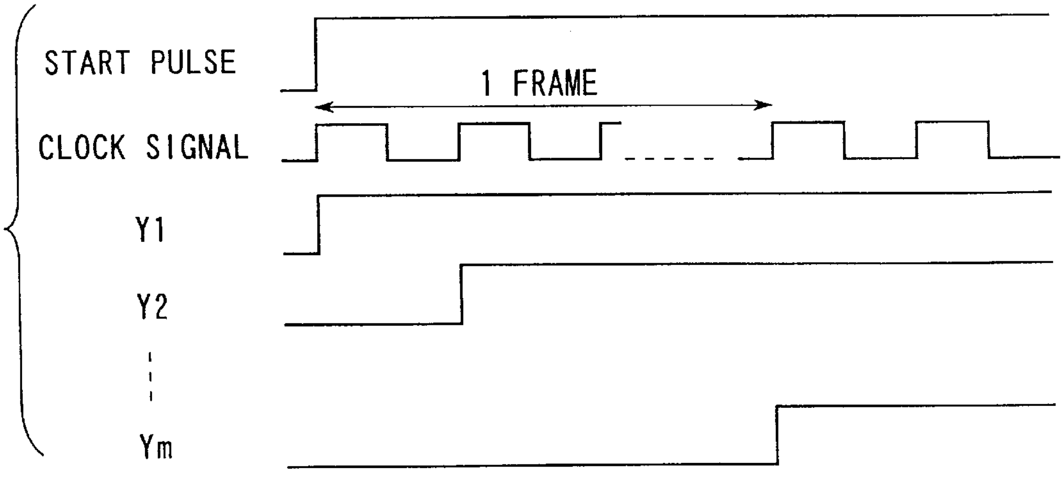
FIG. 7 is a timing chart for driving the scanning line in the step shown in FIG. 5 on the basis of a signal supplied from a first test circuit to a scanning line driving circuit.

In the test process, the first test circuit TS1 supplies a clock signal and a start pulse fixed at a high level to the scanning line driving circuit 18 as shown in FIG. 7. Each of the shift registers of the scanning line driving circuit 18 latches the start pulses in the order of S/R1, S/R2 . . . S/Rm in response to the clock signal. As a result, the scanning lines are driven in the order of Y1, Y2, . . . Ym. Therefore, all the scanning lines Y1 to Ym are driven one frame later to turn on all the TFT's 75 in the direction of the column selected by the scanning lines.

Figure 8:
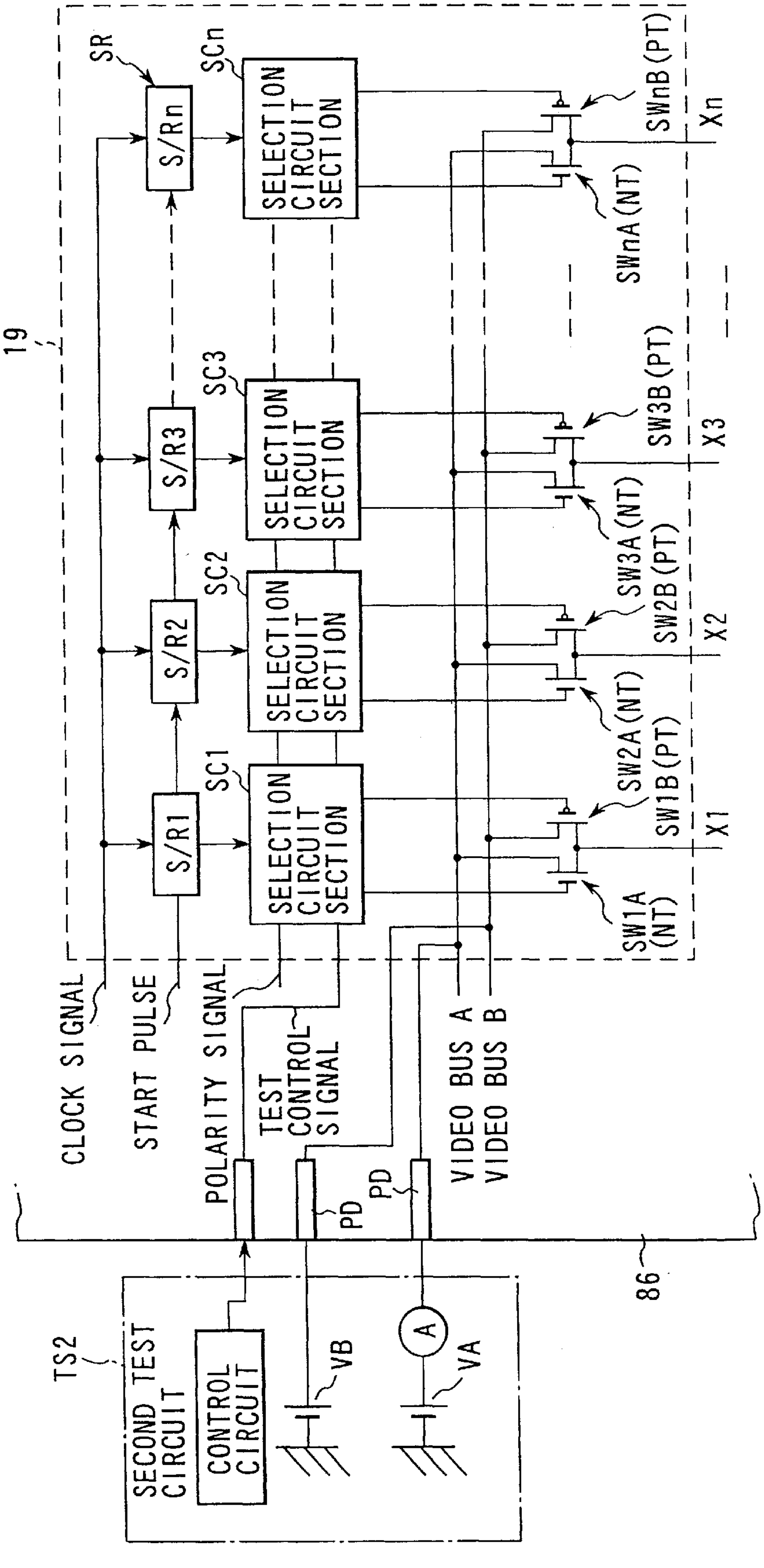
FIG. 8 shows a circuit for counting the number of defects in the substrate test method of the present invention.

Similarly, the first test circuit TS1 supplies a clock signal and a start pulse fixed at a high level to the signal line driving circuit 19 and also supplies a predetermined video signal voltage so as to drive all the signal lines X1, X2, . . . Xn. To be more specific, a fixed voltage of 5V is supplied from a pad PD to each of video buses A and B so as to apply a voltage of 5V to all the signal lines X1, X2, . . . Xn under the control of the shift registers S/R that are sequentially turned on, as shown in FIG. 8. As a result, a predetermined voltage is applied through a signal line to each of all the TFT's 75 that are turned on. In other words, the potential of the signal line is applied to all the pixel electrodes 53 and the storage capacitor electrodes 61 that are electrically connected to each other by the joining wiring 80.

Under this state, the first test circuit TS1 applies a high voltage to all the storage capacitor lines 52 for a predetermined period of time. The high voltage applied to the storage capacitor line 52 represents a voltage forming a potential difference greater than the maximum potential difference formed between the storage capacitor electrode 61 and the storage capacitor line 52 and not greater than 5 times, preferably not greater than 3 times, as large as the maximum potential difference. If a high voltage forming a potential difference more than 5 times as large as the maximum potential difference is applied, the normal storage capacitor elements are adversely affected.

Where a polarity inversion voltage falling within a range of 1 to 9V, whose polarity is inverted against to the 5V, is applied to the signal line during the ordinary driving, a polarity reversed voltage of 1 to 9V is applied to the storage capacitor electrode 61 connected to the signal line X through the TFT. Also, a voltage of 15V is applied to the storage capacitor line 52. In other words, the potential difference between the storage capacitor elements falls within a range of 6 to 14V, i.e., about 10V, during the ordinary driving period. On the other hand, in the testing step by the first test circuit TS1, a fixed voltage of 5V is applied to the storage capacitor electrode 61 connected to the signal line X through the TFT, and a voltage of 20V is applied to the storage capacitor line 52. In other words, the potential difference between the storage capacitor elements is 15V in the testing step. This condition is maintained for 10 seconds or less, preferably for 5 seconds in view of the productivity.

As described above, a predetermined voltage is applied to all the pixel electrodes 52 and the storage capacitor electrodes 61, which are connected to each other via the TFT's 75, by keeping a predetermined voltage applied to all the signal lines X for a predetermined period of time while turning on the TFT's 75 of all the pixels. Under this condition, a high voltage forming a potential difference between the storage capacitor line and storage capacitor electrode larger than that of the ordinary driving is kept applied to all the storage capacitor lines 52 for a predetermined period of time. This makes it possible to apply a high voltage between the storage capacitor elements of all the pixels in a short time so as to achieve short-circuit between the storage capacitor elements in which short-circuit may possibly take place in future, thereby localizing the particular storage capacitor elements.

In the next step, the number of defects occurring in the array substrate in which a high voltage has been applied to the storage capacitor line 52 is counted in the test process. In this embodiment, the test method described in Japanese Patent Application No. 10-169996 is used for counting the number of defects.

To be more specific, a second test circuit TS2 is connected to the signal line driving circuit 19. As shown in FIG. 8, the signal line driving circuit 19 comprises an n-number of registers S/R1 to S/Rn, an n-number of selection circuit sections SC1 to SCn, an n-number of first analog switches SW1A to SWnA, an n-number of second analog switches SW1B to SWnB, and video buses A and B. Each of these first analog switches SW1A to SWnA is formed of an n-channel type polysilicon thin film transistor. Also, each of these second analog switches SW1B to SWnB is formed of a p-channel type polysilicon thin film transistor.

The video bus A transmits a pixel signal having a positive polarity, which is supplied from the outside, and the video bus B transmits a pixel signal having a negative polarity, which is supplied from the outside. The resisters S/R1 to S/Rn are connected in series and serve to latch a start pulse of a negative logic, which is supplied from the outside in a horizontal scanning period, in response to a clock signal supplied in synchronism with the pixel signal supplied from the outside so as to output shift pulses in parallel.

In an "image-on-screen" mode, the selection circuit sections SC1 to SCn perform the selecting operation for selecting one of the first analog switches SW1A to SWnA and the second analog switches SW1B to SWnB at the timing for each of the registers S/R1 to S/Rn to latch the start pulse. The selecting operation is performed on the basis of a polarity signal supplied from the outside and inverted for each frame.

In a positive polarity frame, the first analog switches SW1A to SWnA each consisting of an n-channel TFT are sequentially selected in synchronism with the shifting operation of the shift register SR. The first analog switches SW1A to SWnA serve to sample-hold the pixel signal on the video bus A at the timing selected by the selection circuit sections SC1 to SCn so as to output the pixel signal to the signal lines X1 to Xn.

In a negative polarity frame, the second analog switches SW1B to SWnB each consisting of a p-channel TFT are sequentially selected in synchronism with the shifting operation of the shift register SR. The second analog switches SW1B to SWnB serve to sample-hold the pixel signal on the video bus B at the timing selected by the selection circuit sections SC1 to SCn so as to output the pixel signal to the signal lines X1 to Xn.

The signal driving circuit 19 receives a test control signal in the test process and is connected to the second test circuit TS2 for measuring the currents flowing through the video buses A and B.

In the signal line driving circuit 19, n-pairs of the first and second analog switches SW1A, SW1B; SW2A, SW2B; SW3A, SW3B; . . . ; and SWnA, SWnB are allotted to n-number of signal lines, and the shift registers S/R1 to S/Rn and the selection circuit sections SC1 to SCn sequentially select these n-pairs of the first and second analog switches SW1A, SW1B; SW2A, SW2B; SW3A, SW3B; . . . ; and SWnA, SWnB so as to render conductive one of the selected pairs of the analog switches.

The test control signal is a digital signal. One of the H level and the L level of the digital signal designates the "image-on-screen" mode, with the other designating the "test" mode. The selection circuit section SCn performs the conventional function in the "image-on-screen" mode, and turns on both the analog switches SWnA and SWnB in the "test" mode regardless of the theoretical values "H" and "L" of the polarity signal at the timing for the register S/Rn to latch the start pulse.

If the second test circuit TS2 is connected in the test process, a test control signal generated in the control circuit of the second test circuit TS2 and designating the test mode is outputted to the selection circuit section.

Where the "test" mode is designated by the test control signal, the selection circuit sections SC1 to SCn preferentially perform the control to render conductive simultaneously the paired first and second analog switches that are sequentially selected by the shift register SR regardless of the theoretical value of the polarity signal.

It should be noted that, when the paired analog switches SW1A, SW1B; SW2A, SW2B; SW3A, SW3B; . . . ; SWnA, SWnB allotted to the signal lines are rendered conductive simultaneously, the difference in resistance between the paired analog switches is set at 200 Ω or less.

In the test step, the video bus A is connected to a DC power source VA via a pad PD and an ammeter A, and the video bus B is connected to a DC power source VB via another pad PD. Under the connected state of the DC power sources VA and VB, gate potentials are applied to a thin film transistor PT and a thin film transistor NT to allow the channels of these transistors to exhibit a low resistance simultaneously. If the voltage of the DC power source VB is set higher than that of the DC power source VA, current flows from the DC power source VB toward the DC power source VA via the p-channel type TFT (PT) and the n-channel type TFT (NT), and the current value is measured by the ammeter.

The on-resistance of the paired analog switches consisting of the TFT (PT) and the TFT (NT) can be calculated from the potential difference between the DC power source VA and the DC power source VB and the current value measured by the ammeter.

Therefore, where the on-resistance of the paired analog switches is tested in respect of all the signal lines X1 to Xn, both the TFT (PT) and TFT (NT) included in each of a plurality of pairs and allotted to these signal lines X1 to Xn under the control by the shift register SR are sequentially rendered conductive, and the current values that are obtained sequentially are all measured. In this fashion, it is possible to measure the on-resistance of each of all the paired analog switches corresponding to all the signal lines.

Where the resistance value falls within a range of between 200 Ω and 5000Ω, the on-resistance of the paired analog switches is judges as satisfactory. Where a resistance value higher than the upper limit of the range given above is included, the number of defects is regarded as exceeding a specified value. Naturally, the particular substrate is not supplied to the subsequent manufacturing line so as to be removed. Incidentally, the defect measurement is described in detail in Japanese Patent Application No. 10-169996.

On the other hand, when it comes to a substrate in which the number of defects is not larger than a specified value, the short-circuit of the pixel that can be improved is subjected to a repairing treatment.

To be more specific, the source electrode 89 of the pixel TFT 75 is connected to the pixel electrode 53 via the first joining portion 80A of the joining wiring 80, and the pixel electrode 53 is connected to the storage capacitor electrode 61 via the second joining portion 80B of the joining wiring 80 in the array substrate 86, as shown in FIGS. 2 to 4. It follows that the source electrode 67, the pixel electrode 53 and the storage capacitor electrode 61 are electrically connected to each other via joining portions that are independent of each other.

It should be noted that another conductive film is not present in at least a part of the second joining portion 80B for connecting the pixel electrode 53 to the storage capacitor electrode 61. Also, the particular part is arranged in a region 54 in which a light-shielding film is not present. In other words, at least a part of the second joining portion 80B extends through the aperture 54 formed commonly in the storage capacitor line 52 functioning as a light-shielding conductive film and in the storage capacitor electrode 61 so as not to overlap with the storage capacitor line 52 and the storage capacitor electrode 61. As a result, at least a part of the second joining portion 80B is exposed to the outside when viewed from the back surface side of the array substrate 86. Therefore, where a short-circuit defect has been found between the storage capacitor line 52 and the storage capacitor electrode 61 forming a storage capacitor when a high voltage is applied to the storage capacitor line 52 in the test process described above, the array substrate 86 is irradiated with a laser beam emitted from the back side of the array substrate 86 so as to electrically cut a part of the second joining portion 80B, thereby improving the pixel defect to a semi-lit state and, thus, improving the yield.

It should also be noted that, in this case, another short-circuit with another electrode does not take place because a conductive film is not formed in any of the upper and lower layers of the cut portion. Further, a light-shielding columnar spacer is arranged in a position corresponding to the aperture 54 of the array substrate 86 on the side of the counter substrate 92, making it possible to prevent the display quality from being degraded by a lowered contrast.

As described above, in the substrate test method of the present invention, a first test circuit is connected to an array substrate, and a signal for turning on all the thin film transistors arranged on the array substrate is supplied to a scanning line driving circuit. Also, a predetermined voltage is applied to a signal line driving circuit so as to supply a predetermined voltage to a storage capacitor electrode through signal lines. Under this condition, a high voltage sufficient for forming a potential difference higher than that in the stage of forming a storage capacitor is applied to the storage capacitor line. As a result, it is possible to apply efficiently a high voltage between the storage capacitor line and the storage capacitor electrode for every pixel. By this high voltage application, short-circuit is positively brought about in a pixel in which short-circuit is likely to take place in future so as to localize the defective pixel. It follows that it is possible to prevent short-circuit substantially completely that may take place between a polysilicon film and a metal film after the liquid crystal display panel device is put on the market.

In the next step, a second test circuit is connected to the array substrate to count the number of defects on the array substrate. In this step, the array substrate having defects the number of which exceeds a predetermined value is removed from the manufacturing line. When it comes to the array substrate having defects the number of which is not larger than a predetermined value, the short-circuit defect that can be improved, i.e., the short-circuit between the storage capacitor line and the storage capacitor electrode, is cut away by irradiating a part of the joining wiring exposed to the outside with a laser beam so as to improve the short-circuit defect to a semi-lit state. It follows that it is possible to improve the product yield and to prevent the reliability from being lowered by the occurrence of a pixel defect after the liquid crystal display panel device is put on the market.

In the embodiment described above, a high voltage is applied between the storage capacitor elements of all the pixels in the test process. However, the present invention is not limited to the particular construction, as far as a high voltage can be efficiently applied simultaneously to the storage capacitor elements of a plurality of pixels by the conventional method. For example, it is possible to apply a high voltage to the storage capacitor elements corresponding to each of a plurality of scanning lines or signal lines. It is also possible to apply a high voltage to the storage capacitor elements corresponding to the scanning lines on the odd-numbered rows, followed by applying a high voltage to the storage capacitor elements corresponding to the even-numbered rows. Further, it is possible to divide the screen into upper and lower sections or right and left sections and to apply sequentially a high voltage to the storage capacitor elements corresponding to the divided sections.

As described above, the present invention provides a test method of a substrate. In the present invention, a defective pixel, in which defect may take place in future, is localized by positively bringing about short-circuit between the electrodes forming a storage capacitor so as to prevent a defective substrate from being included in the articles put on the market.

The present invention also provides a test method of a substrate, in which, when it comes to a substrate having defects the number of which is not larger than a specified number, the short-circuit between the electrodes forming a storage capacitor is improved so as to improve the product yield and to improve the reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A test method of a substrate comprising pixel electrodes arranged to form a matrix, a plurality of scanning lines arranged along the rows of said pixel electrodes, a plurality of storage capacitor lines coupled to a plurality of storage capacitor electrodes arranged along said scanning lines and applied a first voltage thereto, a plurality of signal lines arranged along the columns of the pixel electrodes and applied a fourth voltage which is in the range from a second voltage to a third voltage higher than said second voltage, a plurality of switching elements arranged in the vicinity of crossing points between said scanning lines and said signal lines and selectively applying said fourth voltage from said signal lines to said pixel electrodes, said method comprising the steps of:

setting the switching elements associated with plural of said scanning lines ON state;

applying voltages to said signal lines and said storage capacitor lines so that each potential difference between the storage capacitor lines and storage capacitor electrodes is substantially equal to or higher than a maximum potential difference between the first voltage and the fourth voltage; and maintaining said each potential difference between the storage capacitor lines and storage capacitor electrodes for a predetermined period.

2. A test method of a substrate according to claim 1, further comprising, after said voltage applying step, detecting characteristics of said switching element or substantial short-circuit between the storage capacitor lines and the storage capacitor electrodes.

3. A test method of a substrate according to claim 2, wherein said switching elements consists of thin film transistors, each of which includes a first semiconductor film re-crystallized a silicon semiconductor film, and each of said storage capacitor electrodes includes second semiconductor films formed simultaneously in the first semiconductor forming step.

4. A test method of a substrate according to claim 3, wherein each of said first and second semiconductor films is a polycrystalline silicon film.

5. A test method of a substrate according to claim 2, wherein said substrate includes at least one of a signal line driving circuit connected to said signal lines and a scanning line driving circuit connected to said scanning lines.

6. A test method of a substrate according to claim 2, wherein said second voltage is applied to said signal lines and a fifth voltage higher than said third voltage is applied to said storage capacitor lines at said voltage applying step.

7. A test method of a substrate according to claim 2, wherein the potential difference between the storage capacitor lines and storage capacitor electrodes is lower than 20V.

8. A test method of a substrate according to claim 2, further comprising, after said detecting step, in the case that a substantial short-circuit between at least one of said storage capacitor lines and at least one of said storage capacitor electrodes is detected, electrically detaching said corresponding one of said storage capacitor electrodes from corresponding one of said pixel electrodes.

9. A method for testing a substrate having a plurality of pixel electrodes arranged in rows and columns forming a matrix, a plurality of scanning lines arranged along said rows of said pixel electrodes, a plurality of storage capacitors, each having storage capacitor electrodes, a plurality of storage capacitor lines arranged parallel to said scanning lines for applying a first voltage to said storage capacitor electrodes, a plurality of signal lines arranged along said columns of said pixel electrodes for applying a fourth voltage, said fourth voltage is in a range from a second voltage to a third voltage, said third voltage being greater than said second voltage, a plurality of transistor elements arranged about the crossing points between said scanning lines and said signal lines and selectively applying said fourth voltage from said signal lines to said pixel electrodes, said method comprising:

setting the transistor elements associated with said scanning lines in an ON state;

applying voltages to said signal lines and said storage capacitor lines so that each potential difference between the storage capacitor lines and storage capacitor electrodes is substantially equal to or higher than a maximum potential difference between the first voltage and the fourth voltage; and maintaining said each potential difference between the storage capacitor lines and storage capacitor electrodes for a predetermined period.

10. The method for testing a substrate according to claim 9, further comprising:

detecting characteristics of said transistor element after applying said voltage, and detecting any short-circuit between the storage capacitor lines and the storage capacitor electrodes after applying said voltage.

11. The method for testing a substrate according to claim 10, wherein said transistor elements including thin film transistors, each of said thin film transistors includes a first semiconductor film formed by re-crystallizing a silicon semiconductor film, and each of said storage capacitor electrodes includes second semiconductor films formed simultaneously in with the first semiconductor film.

12. The method for testing a substrate according to claim 11, wherein each of said first and second semiconductor films is a polycrystalline silicon film.

13. The method for testing a substrate according to claim 10, wherein said substrate includes at least one of a signal line driving circuit connected to said signal lines and a scanning line driving circuit connected to said scanning lines.

14. The method for testing a substrate according to claim 10, wherein said second voltage is applied to said signal lines and a fifth voltage higher than said third voltage is applied to said storage capacitor lines at said voltage applying step.

15. The method for testing a substrate according to claim 10, wherein the potential difference between the storage capacitor lines and storage capacitor electrodes is lower than 20V.

16. The method for testing a substrate according to claim 10, further including, electrically detaching said corresponding one of said storage capacitor electrodes from corresponding one of said pixel electrodes upon detecting a substantial short-circuit between at least one of said storage capacitor lines and at least one of said storage capacitor electrodes.

* * * * *